United States Patent
Fasoli

(10) Patent No.: US 7,149,119 B2
(45) Date of Patent: Dec. 12, 2006

(54) SYSTEM AND METHOD OF CONTROLLING A THREE-DIMENSIONAL MEMORY

(75) Inventor: Luca G. Fasoli, San Jose, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 104 days.

(21) Appl. No.: 10/955,048

(22) Filed: Sep. 30, 2004

(65) Prior Publication Data

US 2006/0083069 A1   Apr. 20, 2006

(51) Int. Cl.
G11C 16/32 (2006.01)
(52) U.S. Cl. .................. 365/185.19; 365/185.11; 365/185.18
(58) Field of Classification Search .......... 365/185.19, 365/185.11, 185.18, 185.23, 63
See application file for complete search history.

(56) References Cited

U.S. PATENT DOCUMENTS

| | | | | |
|---|---|---|---|---|
| 4,989,185 A | * | 1/1991 | Matsuo et al. | 365/185.11 |
| 5,097,445 A | * | 3/1992 | Yamauchi | 365/195 |
| 5,307,470 A | * | 4/1994 | Kataoka et al. | 711/103 |
| 5,375,083 A | * | 12/1994 | Yamaguchi | 365/185.27 |
| 5,396,468 A | | 3/1995 | Harari et al. | |
| 5,872,994 A | * | 2/1999 | Akiyama et al. | 712/43 |
| 5,991,517 A | | 11/1999 | Harari et al. | |
| 6,119,245 A | * | 9/2000 | Hiratsuka | 714/7 |
| 6,134,141 A | | 10/2000 | Wong | |
| 6,166,950 A | * | 12/2000 | Yamada et al. | 365/185.03 |
| 6,212,101 B1 | | 4/2001 | Lee | |
| 6,399,441 B1 | | 6/2002 | Ogura et al. | |
| 6,545,891 B1 | | 4/2003 | Tringali | |
| 6,711,043 B1 | | 3/2004 | Friedman et al. | |
| 6,765,271 B1 | | 7/2004 | Iijima | |
| 6,765,813 B1 | | 7/2004 | Scheuerlein et al. | |
| 6,996,055 B1 | * | 2/2006 | Mori et al. | 365/185.04 |

OTHER PUBLICATIONS

"An Overview of Logic Architectures Inside Flash Memory Devices," by Andre Silvagni, et al. 0018-9218/03 IEEE 2003.
"Vth and Erase/Prog Cell Current Distribution," by Tanmay Kumar, et al. Matrix Memory Nov. 13, 2003.
Specification, U.S. Appl. No. 10/024,646.
Specification, U.S. Appl. No. 09/877,719.
Specification, U.S. Appl. No. 10/335,078.
Specification, U.S. Appl. No. 10/335,089.
Specification, U.S. Appl. No. 10/729,831.
Specification, U.S. Appl. No. 10/729,844.
Specification, U.S. Appl. No. 10/729,865.

* cited by examiner

*Primary Examiner*—Tan T. Nguyen
(74) *Attorney, Agent, or Firm*—Toler Schaffer, LLP

(57) ABSTRACT

A system and method of controlling a three dimensional memory is disclosed. In a particular embodiment, the system is implemented as an integrated circuit including a microcontroller having a control signal output, a three-dimensional monolithic non-volatile memory having a plurality of levels of memory cells above a silicon substrate and having an input responsive to the control signal output, a counter coupled to the microcontroller, and a program memory. The counter is to step through a series of time steps defining a program pulse time interval of a first program pulse to be applied to at least one selected memory cell within the three-dimensional monolithic non-volatile memory. The program memory is accessible to the microcontroller, and the program memory includes a sequence of program instructions corresponding to a memory operation with respect to the three-dimensional monolithic non-volatile memory.

23 Claims, 7 Drawing Sheets

SYSTEM AND METHOD OF CONTROLLING A THREE-DIMENSIONAL MEMORY

FIELD OF THE DISCLOSURE

The present disclosure relates generally to a system and method of controlling a three-dimensional memory.

BACKGROUND

Read-write non-volatile memories, such as floating gate based or SONOS memories require complex algorithms to correctly perform basic operations. For example, a program operation usually includes providing a program pulse, performing a read with some margin, and repeating these two steps until all the cells reach desired threshold values. Three-dimensional memories, due to the intrinsic nature of TFT devices, e.g. greater variations and a limited threshold window, would likely require algorithms that are even more complicated than those typically applied to memories built on single crystal silicon. Moreover, these algorithms may need to be adjusted and changed as more is learned about three-dimensional memory technology. There is a need to address the requirements of implementing these complex algorithms in a simple, easy to modify and portable way.

Accordingly, there is a need for an improved system and method of controlling three-dimensional memories.

SUMMARY

A system and method of controlling a three dimensional memory is disclosed. In a particular embodiment, the system is implemented as an integrated circuit including a microcontroller having a control signal output, a three-dimensional monolithic non-volatile memory having a plurality of levels of memory cells above a silicon substrate and having an input responsive to the control signal output, a counter coupled to the microcontroller, and a program memory. The counter is to step through a series of time steps defining a program pulse time interval of a first program pulse to be applied to at least one selected memory cell within the three-dimensional monolithic non-volatile memory. The program memory is accessible to the microcontroller, and the program memory includes a sequence of program instructions corresponding to a memory operation with respect to the three-dimensional monolithic non-volatile memory.

In a particular embodiment, the method is a method of accessing a three-dimensional memory. The method includes reading instructions from a program memory at a controller coupled to the three-dimensional memory, executing the instructions at the controller, and sending control signals including program pulses having program voltages and pulse intervals determined based on the instructions executed by the controller from the controller to the three-dimensional memory in response to executing the instructions at the controller. The three-dimensional memory is a non-volatile memory and the control signals sent to the three-dimensional memory correspond to a memory operation, such as a pulse program operation.

DETAILED DESCRIPTION OF THE DRAWINGS

Figure 1:
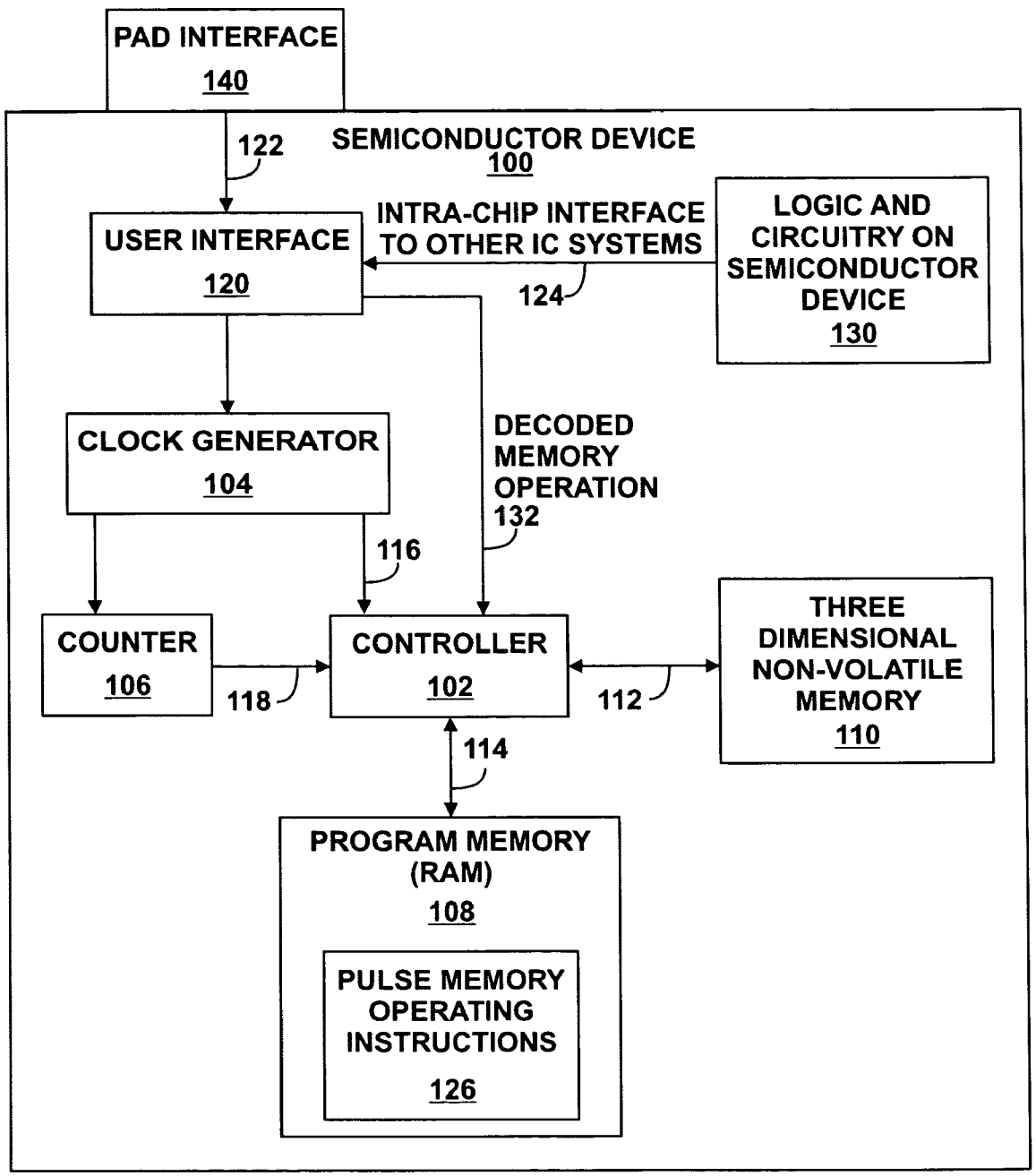
FIG. 1 is a block diagram of a semiconductor device having a controller and a three-dimensional (3-D) monolithic non-volatile memory.

Referring to FIG. 1, a semiconductor device 100 is disclosed. The semiconductor device 100 includes an input/output pad interface 140 coupled to a user interface 120. Semiconductor device 100 further includes a controller 102 and a program memory 108 that is coupled to the controller 102 via a memory bus 114. The controller 102 is responsive to a counter 106 and in particular, to a clock signal 116 from a clock generator 104. The clock generator 104 is responsive to the user interface 120. User interface 120, in an optional embodiment, has an additional interface 124 to logic and circuitry 130. In a particular embodiment, the logic circuit 130 includes other modules within the semiconductor device 100 in a system on a chip type implementation.

The controller 102, such as a microprocessor, provides control signals to and retrieves data from a three-dimensional (3-D) monolithic non-volatile memory 110 over an interface 112. In a particular embodiment, the 3-D monolithic non-volatile memory 110 includes a vertically stacked memory array and related circuits, such as regulators, charge pumps, and other associated logic. The three-dimensional (3-D) memory 110 includes a plurality of levels of memory cells above a silicon substrate. In a particular embodiment, the 3-D memory cells include diode elements. In another embodiment, the memory cells include modifiable conductance switch devices arranged in a plurality of series-connected NAND strings. The 3-D memory may include TFT and may be a floating gate or SONOS based read-write non-volatile memory. Further details of various examples of suitable 3-D memory devices are provided in U.S. Pat. No. 6,034,882 and U.S. patent application Ser. Nos. 09/927,648; 10/335,078; 10/729,831 and 10/335,089, all assigned to the instant assignee and incorporated herein by reference.

The program memory 108 includes memory operation instructions 126. The program memory 108 may be a two-dimensional memory such as a random access memory (RAM), an electrically erasable programmable read only memory (EEPROM), or a read only memory (ROM). Alternately, the program memory may be embedded within a portion of the 3-D memory. The memory operation instructions 126 may be instructions for providing a write or erase command that is executed by controller 102 in order to provide for a specific sequence of control signals communicated over interface 112 for performing a memory operation with respect to a selected memory cell within the three-dimensional non-volatile memory 110. In one embodiment, the sequence of program instructions provides built-in self tests.

During operation, a command is received at the user interface 120, such as from the pad 140, via input interface 122, or from the intra-chip interface 124. In a particular embodiment, the command is decoded at the user interface and a signal is provided to clock generator 104. The clock generator 104 provides a clocking signal 116 to controller 102. Controller 102 receives a decoded memory operation 132 from the user interface 120 and accesses the program memory 108 based on the decoded memory operation and retrieves and executes a sequence of memory operation instructions 126. In connection with execution of the particular memory operation instructions, a sequence of control signals are provided by the controller 102 over an interface 112 to access and apply pulse signals to the 3-D non-volatile memory 110. The control signals include address data to identify a particular memory cell or a block of memory cells within the 3-D memory 110. In a particular embodiment, the addressed memory cells may be located at a common level or at different levels within the 3-D memory.

Figure 2:
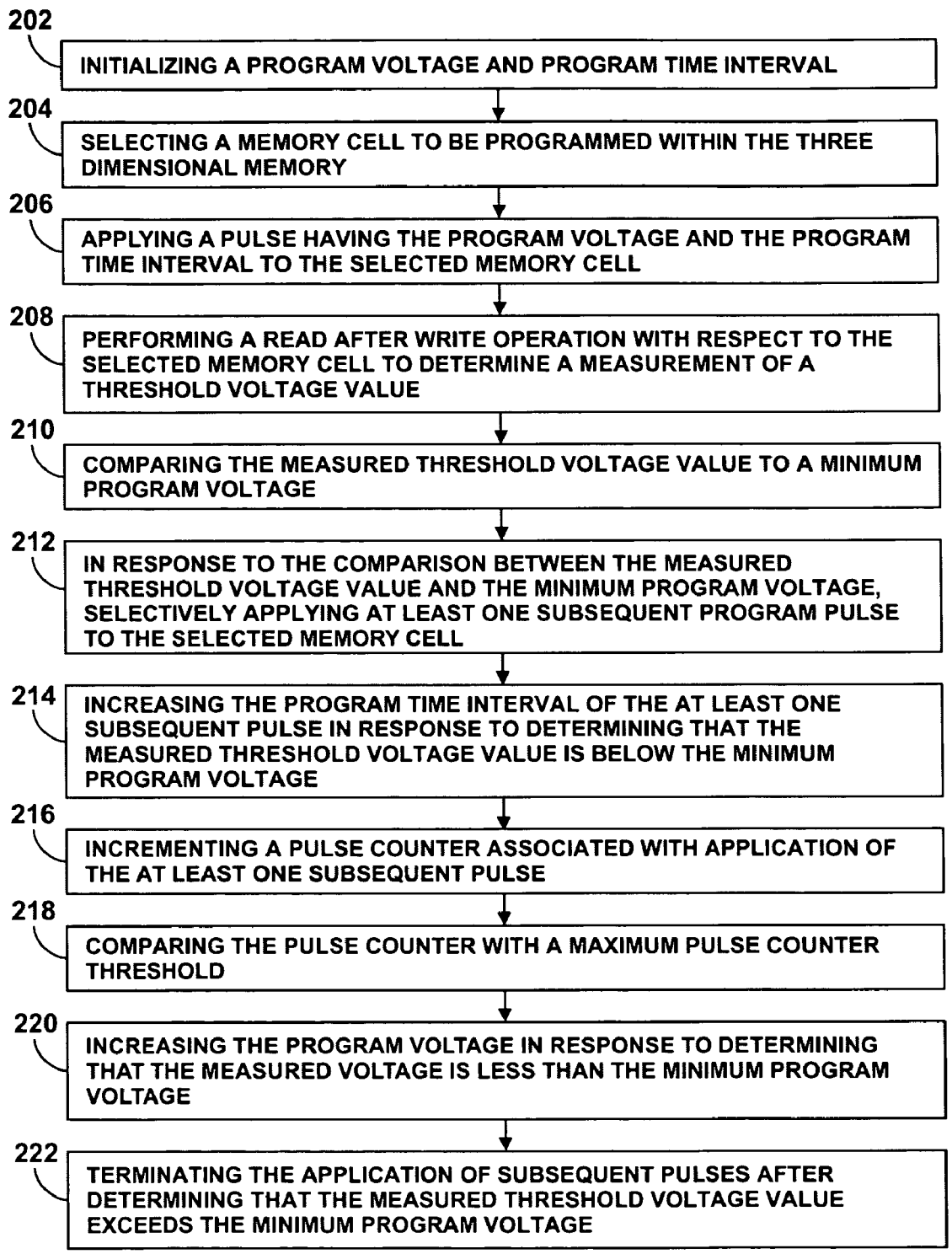
FIG. 2 is a flow chart that illustrates a method of programming a 3-D memory.

Referring to FIG. 2, an illustrative method may be implemented by the controller 102 based on the memory instructions in the program memory 126 within the semiconductor device 100 as shown. The method disclosed may be used to program a 3-D memory, such as the illustrative memory 110. The method includes initializing a program voltage and program time interval, as shown at 202. A memory cell is selected to be programmed within the 3-D memory, at 204. The method further includes applying a pulse having the program voltage and the program time interval to the selected memory cell, at 206. A read-after-write operation is then performed with respect to the selected memory cell to determine a measurement of the threshold voltage value, at 208. The measured threshold voltage value is compared to a minimum program voltage, at 210, and in response to the comparison between the measured threshold voltage value and the minimum program voltage, at least one subsequent program pulse is selectively applied to the selected memory cell, at 212.

In a particular illustrative embodiment, the method further includes increasing the program time interval of the subsequent pulse in response to determining that the measured threshold voltage value is below the minimum program voltage, as illustrated at 214. In a particular embodiment, this step of increasing the program time interval is an optional feature of the method. Further, the method may include a step of incrementing a pulse counter associated with application of the subsequent pulse, at 216. A pulse counter, such as counter 106, can be used to count a total number of program pulses that has been applied to the memory cell and to determine when a maximum number of pulses have been applied. An example counter may be coupled to a controller that executes the programming method or may be embedded within the controller.

The pulse counter value may then be compared with a maximum pulse counter threshold, as shown at 218. The program voltage is increased in response to determining that the measured voltage is less than the minimum program voltage, as shown at 220. At some point in applying the sequence of pulses, either the minimum program voltage is reached or the maximum number of pulses is applied. The application of the sequence of pulse signals is then terminated and the method is completed, as shown at 222.

Figure 3:
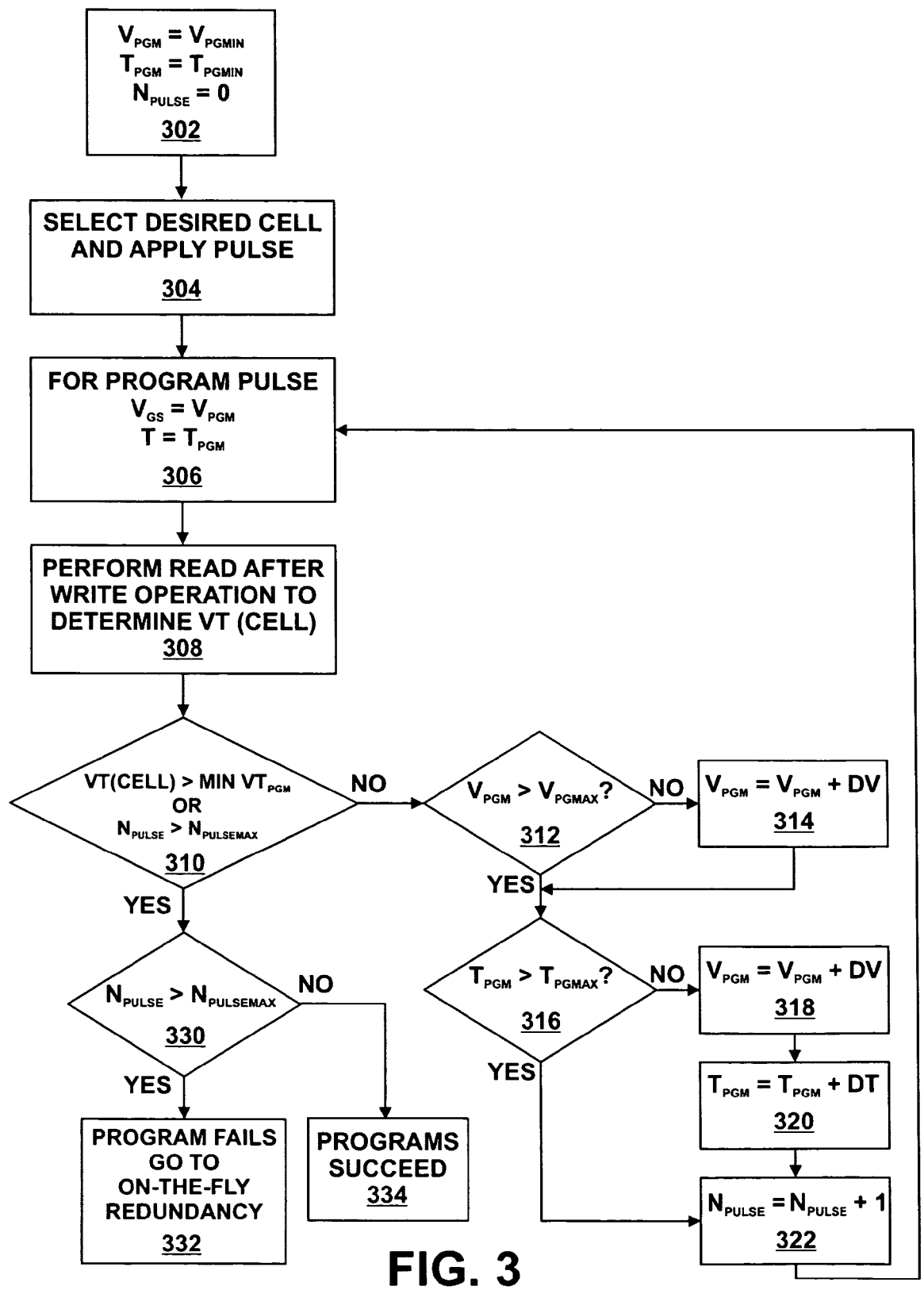
FIG. 3 is a flow chart that illustrates a detailed method of programming a 3-D memory.

Referring to FIG. 3, a further detailed illustration of a method of programming a 3-D memory is shown. A voltage setting for a program voltage pulse is initialized as the program voltage minimum and a time interval program value is initialized as the time interval program minimum for the program pulse, as shown at 302. A counter value labeled "N-pulse" is initialized to a zero value. At 304, a desired memory cell within the 3-D memory is selected. At 306, the program pulse to be applied to the selected memory cell is programmed. In a particular embodiment, the program pulse is programmed by setting the voltage at the gate source to the program voltage and setting the time interval for the program pulse to the initialized time interval program value. The program pulse is applied to the three-dimensional memory. Further, a read-after-write operation is performed after application of the program pulse to determine a voltage threshold measurement for the memory cell, as shown at 308.

The measured voltage threshold for the cell is compared to a minimum program voltage and the pulse counter is compared to a maximum number of pulses, as shown at decision step 310. If the measured voltage is not greater than the minimum program voltage or the pulse counter is not greater than the maximum number of pulses, then processing continues with decision step 312. At decision step 312, the program voltage is compared to a maximum program voltage. When the program voltage exceeds the maximum program voltage available, processing continues to decision step 316. However, when the program voltage does not exceed the maximum program voltage, then the program voltage $V_{PGM}$ is set equal to the previous program voltage plus a voltage program increment, "DV" for "delta voltage", at 314. The delta voltage is an incremental voltage added to the previously applied voltage to increase the program voltage pulse in a step-wise fashion.

After the program voltage has been incremented, processing continues at decision step 316, where the time interval for the program pulse is compared to a maximum program pulse time interval. When the program pulse time interval does not exceed the maximum, the program voltage and/or the time interval may be increased, as shown at 318 and 320. In an alternative embodiment, the voltage and/or the time interval may be incremented only after a defined number of measurements have failed to exceed the maximum program voltage. In this situation, a change in the program voltage level or the time interval may be performed after a set number of pulses or periodically after a time period. As shown at 322, the pulse counter is incremented to track another applied program pulse and processing then returns for the loop, back to step 306.

Returning again to decision step 310, when either the voltage threshold measurement exceeds the minimum voltage program voltage or the number of pulses exceeds the maximum number of pulses, then the method continues to decision step 330, where the measured pulse count is compared to the maximum number of pulses. When the measured pulse count exceeds the maximum number of pulses, then the memory programming effort has failed, and an on the fly redundancy routine is executed, as shown at 332. When the measured pulse count does not exceed the maximum number of pulses, as determined at 330, then the method is completed and the pulse program has succeeded, as shown at 334. The selected memory cell has been successfully programmed.

In a particular illustrative embodiment, the minimum voltage threshold for a program voltage, $V_{PGM}$ is between 0 volts and 2 volts and in particular example may be 1.3 volts. The program voltage minimum, $V_{PGMIN}$, may be in a range of 8 to 10 volts, with 9 volts as a particular example. The time interval for a maximum pulse, $T_{PGMAX}$, is between 5 and 15 microseconds with 10 microseconds as a particular illustrative example. The maximum number of pulses, $N_{PULSEMAX}$, may range between around 10 to 30 pulses with 20 as an illustrative example. The incremental voltage value DV may vary from around 0.25 volts to 1 volt with 0.5 volts as a particular example. The maximum program voltage, $V_{PGMAX}$, may have a range from about 12 to 18 volts with 15 volts as a particular example, and the time increment, DT, may vary from 0 to 5 microseconds with 0 as a particular example. When the time increment, DT, is set to 0, all pulses have the same time interval and the time interval is not increased for any of the pulses. The time interval maximum, $T_{PGMAX}$, may be set in a range between 10 microseconds and 100 microseconds with 10 microseconds as a particular example for implementation. The above illustrative values and ranges are merely examples and do not limit the scope of the present invention in any manner.

In addition, it should be understood that multiple cells can be programmed at the same time. As particular cells get programmed, no further program pulses are provided. Those cells that have not been programmed continue to receive new program pulses.

Figure 4:
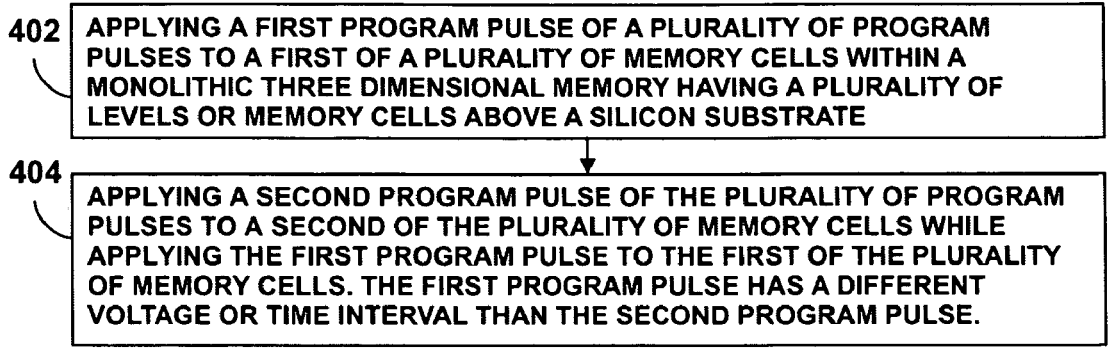
FIG. 4 is a flow chart that illustrates a method of erasing a 3-D memory.

Referring to FIG. 4, a method of applying a plurality of program pulses to a plurality of memory cells within a monolithic 3-D dimensional memory having a plurality of levels of cells above a silicon substrate is shown. The illustrative method includes applying a first program pulse of a plurality of program pulses to a first of a plurality of memory cells. This step is illustrated at 402. A second program pulse of the plurality of program pulses is applied to a second of the plurality of memory cells while applying the first program pulse to the first of the plurality of memory cells as shown at 404. The first of the plurality of memory cells is located within a first substantially planar level of the 3-D memory and the second of the plurality of memory cells is located within a second substantially planar level of 3-D memory. In a particular embodiment, the first program pulse has a different program pulse voltage or a different program pulse time interval than the second program pulse. In another illustrative embodiment, a third program pulse or subsequent additional pulses may be applied to the first memory cell after the second program pulse is no longer being applied and after the second of the plurality of memory cells has been successfully programmed.

In a particular embodiment, additional memory cells may be programmed using additional pulses and the memory may be a vertically stacked 3-D memory with two or more memory cell levels. In another illustrative embodiment, a third program pulse may be applied to a third of a plurality of memory cells within a third level within the 3-D memory. In a particular example, the first program pulse has an initial voltage value between 8 and 10 volts and subsequent pulses are applied that have a voltage value greater than the initial voltage value up to a maximum voltage value of around 18 volts. The additional program pulses may have an incremental voltage applied to increase from the initial voltage to the maximum voltage in a step-wise fashion. The time interval for an illustrative program pulse may be around 10 microseconds. The above illustrative values and ranges are merely examples and do not limit the scope of the present invention in any manner.

Figure 5:
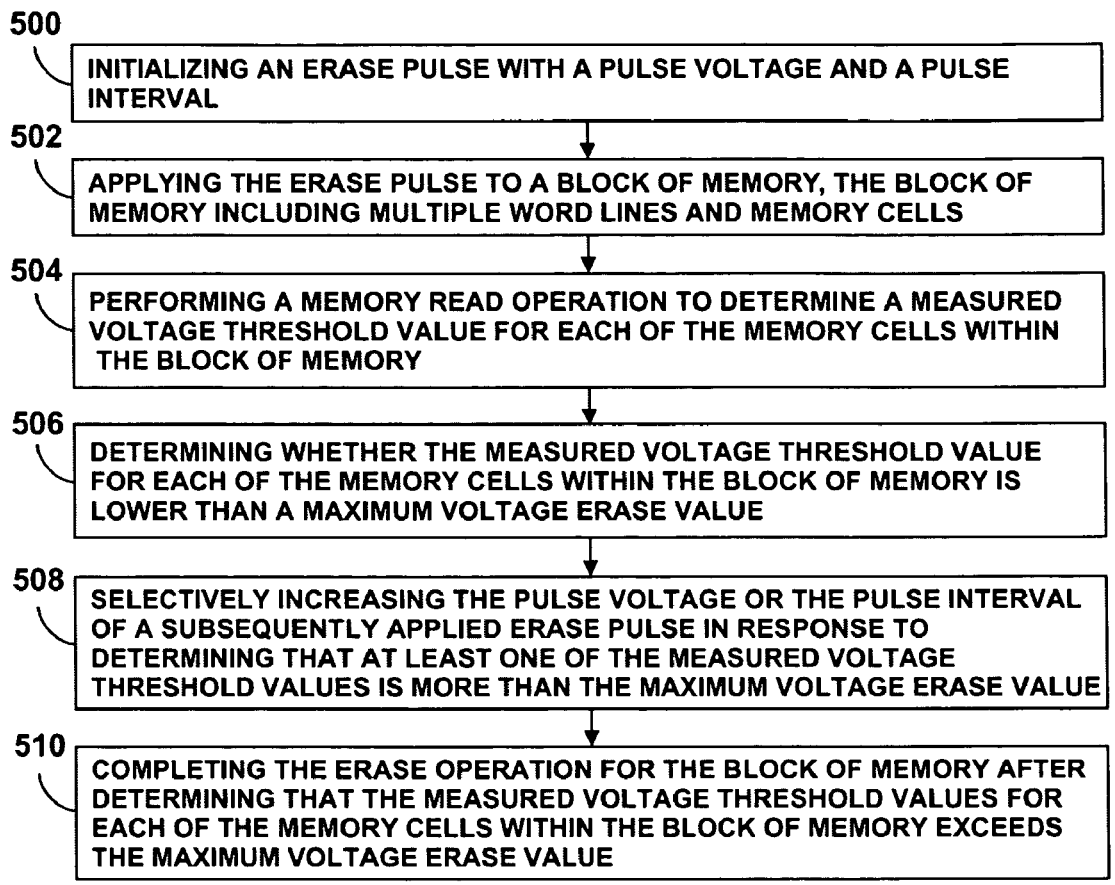
FIG. 5 is a flow chart that illustrates a method of erasing a block of memory with a 3-D memory.

Referring to FIG. 5, an illustrative embodiment of a method of erasing a block of memory within a three-dimensional non-volatile memory device is illustrated. The method includes initializing an erase pulse with a pulse voltage and a pulse interval, as shown at 500. The method further includes applying the erase pulse to a block of memory where the block of memory includes multiple word lines and memory cells, as shown at 502. The method further includes performing a memory read operation to determine a measured voltage threshold value for each of the memory cells within the block of memory, as shown at 504. A determination is made whether the measured threshold voltage value for each of the memory cells within the block of memory is lower than a maximum voltage erase value, as shown at 506. The pulse voltage or the pulse interval or both may be selectively increased for a subsequently applied erase pulse in response to determining that at least one of the measured voltage threshold values is more than the maximum voltage erase value, as shown at 508. The erase operation is completed, as shown at 510, for the particular block of memory after determining that the measured voltage threshold values for each of the memory cells within the block of memory exceed the maximum voltage erase value.

Figure 6:
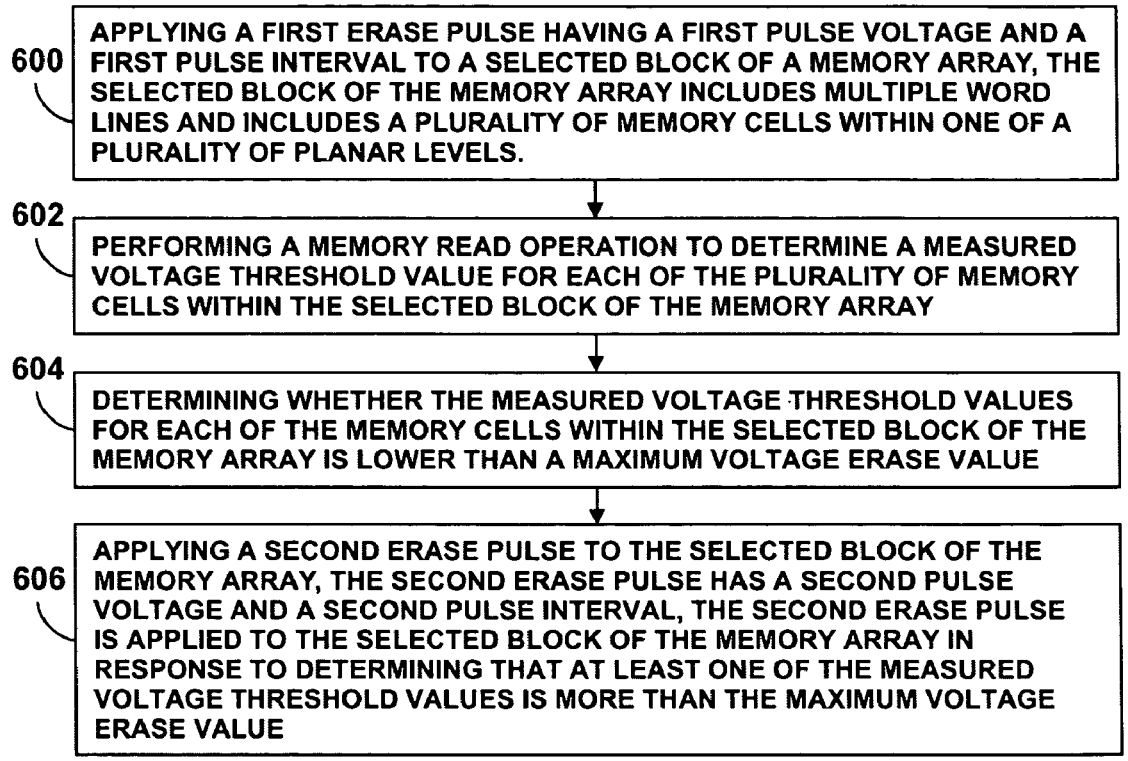
FIG. 6 is a flow chart that illustrates a method of applying program pulses to a 3-D memory.

Referring to FIG. 6, an illustrative embodiment of a method of erasing a block of memory within a memory having a plurality of planar levels where each of the plurality and planar levels includes an array of memory cells is shown. The method includes applying a first erase pulse having a first pulse voltage and a first pulse interval to a selected block of a memory array, at 600. The selected block of the memory array includes multiple word lines and includes a plurality of memory cells within one of the plurality of planar levels. In a particular embodiment, the plurality of memory cells may include modifiable conduction switch devices arranged in a plurality of series connected NAND strings. The method further includes performing a memory read operation to determine a measured voltage threshold value for each of the plurality of memory cells within the selected block of the memory array, as shown at 602. The method includes making a determination as to whether the measured voltage value for each of the memory cells is lower than a maximum voltage erase value, as shown at 604. The method further includes applying a second erase pulse to the selected block of the memory array where the second erase pulse has a second pulse voltage and a second pulse interval. The second erase pulse is applied to the selected block of the memory array in response to determining that at least one of the measured voltage threshold values is more than the maximum voltage erase value as shown at 606. While not specifically shown, it is to be understood that a third erase pulse and subsequent erase pulses may further be applied until the maximum voltage erase value is reached for each of the memory cells of the memory block.

With the disclosed system, multiple blocks can be erased concurrently. As particular blocks get erased, no further erase pulses are provided to such blocks. Those blocks not erased continue to receive new erase pulses.

Figure 7:
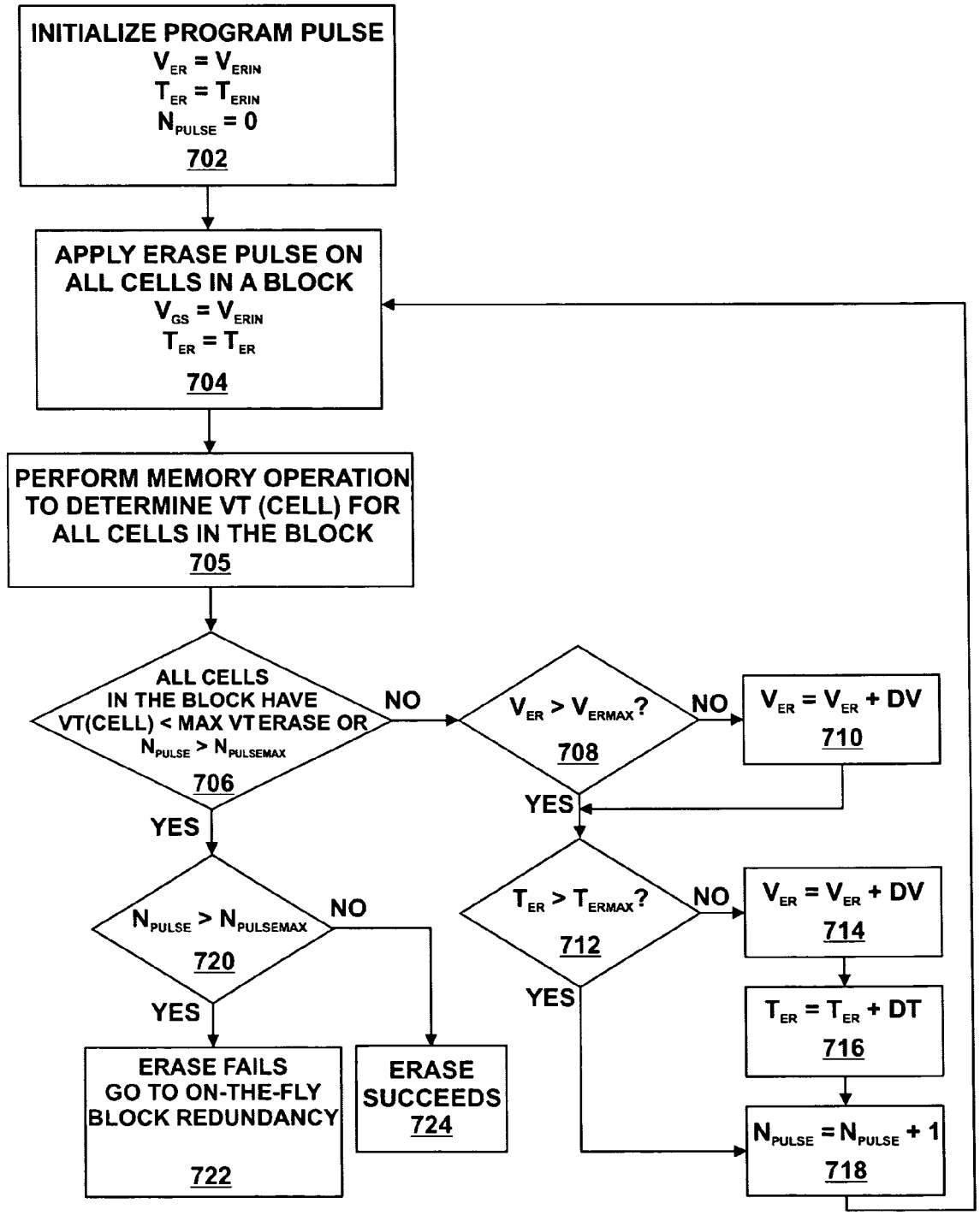
FIG. 7 is a flow chart that illustrates a method of applying erase pulses to a 3-D memory.

Referring to FIG. 7, a method of applying erase pulses to a three-dimensional non-volatile memory is shown. The method includes a first step of initializing an erase pulse voltage and time interval as shown at 702. In addition, a pulse count is initialized to a zero value. The method further includes applying an erase pulse on all cells in a memory block, at 704. In a particular example, the erase pulse is applied by setting a gate to source voltage and a timer for implementing an erase pulse time interval. A memory operation is then performed to determine a voltage threshold for all cells in the block, at 705. An example of such a memory operation is a read after write type operation.

Referring to decision step 706, it is determined whether all cells in the memory block have a measured voltage threshold value less than a maximum threshold voltage erase value or whether the pulse count is greater than a maximum pulse count. When all cells in the memory block do not have a voltage threshold less than the maximum voltage threshold erase value or the pulse count is not greater than the maximum pulse count then processing continues at decision step 708. In this scenario, the erase voltage is compared to a maximum erase voltage. When the erase voltage is less than the maximum erase voltage then the erase voltage is incremented by DV, as shown at 710. In the event that the erase voltage is greater than the maximum erase voltage then processing continues at decision step 712. The erase pulse time interval is compared to a maximum pulse time interval and if the erase pulse time interval is not greater than the maximum pulse time interval, then an erase voltage and/or time interval for the erase pulse may be incremented, as shown at steps 714 and 716. In addition, the pulse count $N_{PULSE}$ as shown in FIG. 7 can be incremented. After incrementing the pulse count, processing continues back at step 704 and the loop is continued.

Referring again to decision step 706, when all cells in the memory block have measured voltage threshold values less than the maximum erase voltage or when the pulse count has exceeded the maximum pulse count, then processing continues to decision step 720. At this decision step, if the pulse count has exceeded the maximum pulse count, then the erase operation has failed, as shown at 722. With an erase failure, operation processing then is provided to initiate a block redundancy operation. Where the pulse count does not exceed the maximum pulse count at decision step 720, then the erase operation has succeeded, as shown at step 724. Processing is completed since the erase operation has been successfully performed.

The above-disclosed subject matter is to be considered illustrative, and not restrictive, and the appended claims are intended to cover all such modifications, enhancements, and other embodiments which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An integrated circuit comprising:
   a microcontroller having a control signal output;
   a three-dimensional monolithic non-volatile memory having a plurality of levels of memory cells above a silicon substrate and having an input responsive to the control signal output;
   a counter coupled to the microcontroller, the counter to step through a series of time steps defining a program pulse time interval of a first program pulse to be applied to at least one selected memory cell within the three-dimensional monolithic non-volatile memory; and
   a program memory accessible to the microcontroller, the program memory including a sequence of program instructions corresponding to a memory operation with respect to the three-dimensional monolithic non-volatile memory.

2. The integrated circuit of claim 1, wherein the counter steps through time steps of a second program pulse that is applied to the selected memory cell in connection with the memory operation.

3. The integrated circuit of claim 2, wherein the first program pulse has a first program voltage and wherein the second program pulse has a second program voltage that is greater than the first program voltage, but less than a predetermined maximum program voltage.

4. The integrated circuit of claim 1, further comprising a user interface module responsive to user commands and a clock generator responsive to the user interface module, the microcontroller having a clock input responsive to the clock generator.

5. The integrated circuit of claim 1, wherein the three-dimensional non-volatile memory includes a plurality of levels of memory cells stacked on or above one another.

6. The integrated circuit of claim 5, wherein each of the plurality of levels of memory cells are stacked on or above one side of a substrate.

7. The integrated circuit of claim 1, wherein the memory operation comprises a memory program operation.

8. The integrated circuit of claim 7, wherein the memory program operation comprises a first portion including providing the first program pulse and a second portion including providing a read-after-write function.

9. The integrated circuit of claim 1, wherein the memory operation comprises a memory erase operation, and wherein the first program pulse is applied to a plurality of memory cells, and wherein the three-dimensional monolithic non-volatile memory includes vertically stacked memory cells.

10. The integrated circuit of claim 1, wherein the three-dimensional memory includes SONOS transistors.

11. The integrated circuit of claim 1, wherein the three-dimensional memory includes TFT transistors.

12. The integrated circuit of claim 1, wherein the three-dimensional memory is a floating gaze-based read-write non-volatile memory.

13. The integrated circuit of claim 1, wherein the three-dimensional memory is a vertically stacked non-volatile memory device and wherein at least one of the memory cells includes a diode.

14. The integrated circuit of claim 1, wherein the program memory is a two-dimensional non-volatile memory.

15. The integrated circuit of claim 1, wherein the sequence of program instructions comprises a built-in self test procedure.

16. The integrated circuit of claim 1, further comprising a random access memory coupled to the microcontroller.

17. The integrated circuit of claim 16, wherein the random access memory stores at least a portion of the sequence of program instructions.

18. The integrated circuit of claim 16, wherein the random access memory stores a second sequence of program instructions and wherein the microcontroller executes the second sequence of program instructions from the random access memory to execute a second memory operation upon the three-dimensional memory.

19. The integrated circuit of claim 1, wherein at least a portion of the sequence of program instructions are stored within an array within the three-dimensional memory instead of within the program memory.

20. The integrated circuit of claim 1, wherein the program memory is a dedicated electrically erasable programmable read only memory (EEPROM) device on the same substrate as the three-dimensional monolithic non-volatile memory.

21. The integrated circuit of claim 1, further comprising additional circuit logic and further comprising a user interface module responsive to commands provided by the additional circuit logic, the user interface module coupled to the microcontroller.

22. The integrated circuit of claim 1, wherein the program memory is a read only memory (ROM).

23. An integrated circuit comprising:
   a microcontroller having a control signal output;
   a three dimensional non-volatile memory having an input responsive to the control signal output: and
   a program memory accessible to the microcontroller, the program memory including a sequence of program instructions corresponding to a memory operation with respect to the three dimensional non-volatile memory, wherein at least a portion of the sequence of program instructions are stored within an array within the three dimensional memory instead of within the program memory.

* * * * *